(12) United States Patent
Hatano et al.

(10) Patent No.: US 6,452,243 B1
(45) Date of Patent: Sep. 17, 2002

(54) SOLID STATE IMAGE SENSOR AND METHOD FOR FABRICATING THE SAME

(75) Inventors: Keisuke Hatano; Yasutaka Nakashiba, both of Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/467,604

(22) Filed: Dec. 20, 1999

(30) Foreign Application Priority Data

Dec. 18, 1998 (JP) ............................................ 10-360134

(51) Int. Cl.⁷ .............................................. H01L 31/00
(52) U.S. Cl. .......................... 257/448; 257/459; 438/48
(58) Field of Search .............................. 257/443, 448, 257/459; 438/48, 54, 66, 67, 69, 73, 80, 982

(56) References Cited

U.S. PATENT DOCUMENTS 5,712,497 A * 1/1998 Watanabe et al. ............ 257/218
5,773,859 A * 6/1998 Ueno .......................... 257/294

FOREIGN PATENT DOCUMENTS

| JP | 4-207076 | 7/1992 | .................. 257/440 |
| JP | 8-293592 | 11/1996 | |
| JP | 9-237888 | 9/1997 | ......... H01L/29/762 |
| JP | 10135442 A | * 5/1998 | ......... H01L/27/148 |

* cited by examiner

Primary Examiner—Nathan Flynn
Assistant Examiner—Scott R. Wilson
(74) Attorney, Agent, or Firm—Dickstein Shapiro Morin & Oshinsky LLP

(57) ABSTRACT

In a solid state image sensor, transfer electrodes are formed by selectively etch-removing a single layer of conducting electrode material at a plurality of first regions which divide the single layer of conducting electrode material in a row direction for each one pixel. A patterned mask is formed to cover the first regions and the single layer of conducting electrode material but to expose the single layer of conducting electrode material at a second region above each of the photoelectric conversion sections, and the single layer of conducting electrode material is selectively etch-removed using the patterned mask as a mask. Thereafter, a first conductivity type impurity and a second conductivity type impurity are ion-implanted using the patterned mask and the single layer of conducting electrode material as a mask, to form the photoelectric conversion section at the second region.

6 Claims, 18 Drawing Sheets

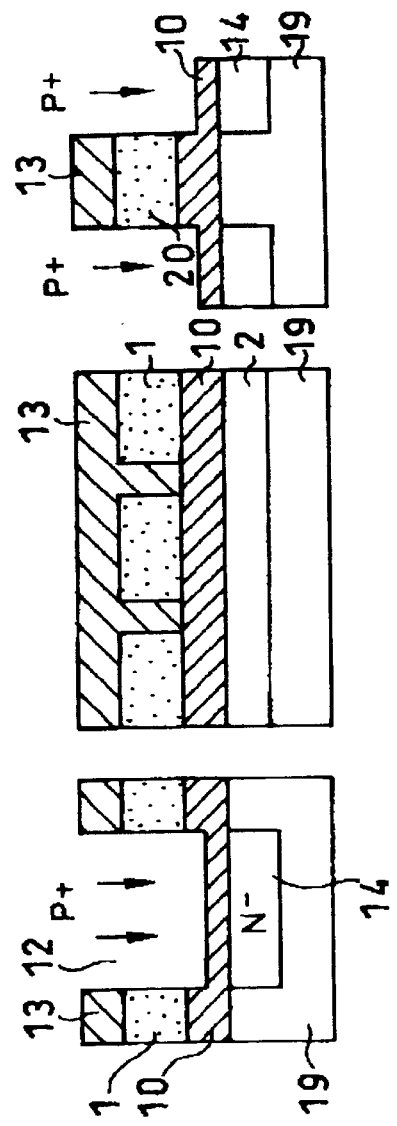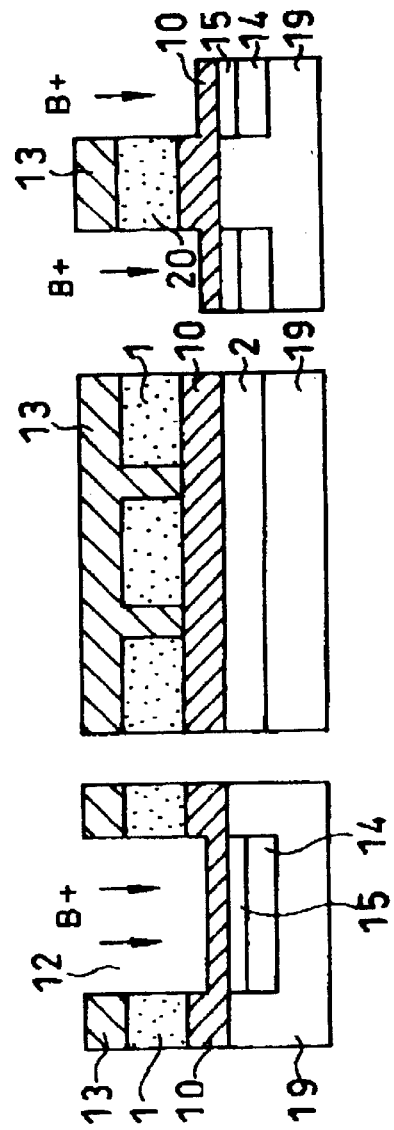
Fig. 11C
Fig. 11D

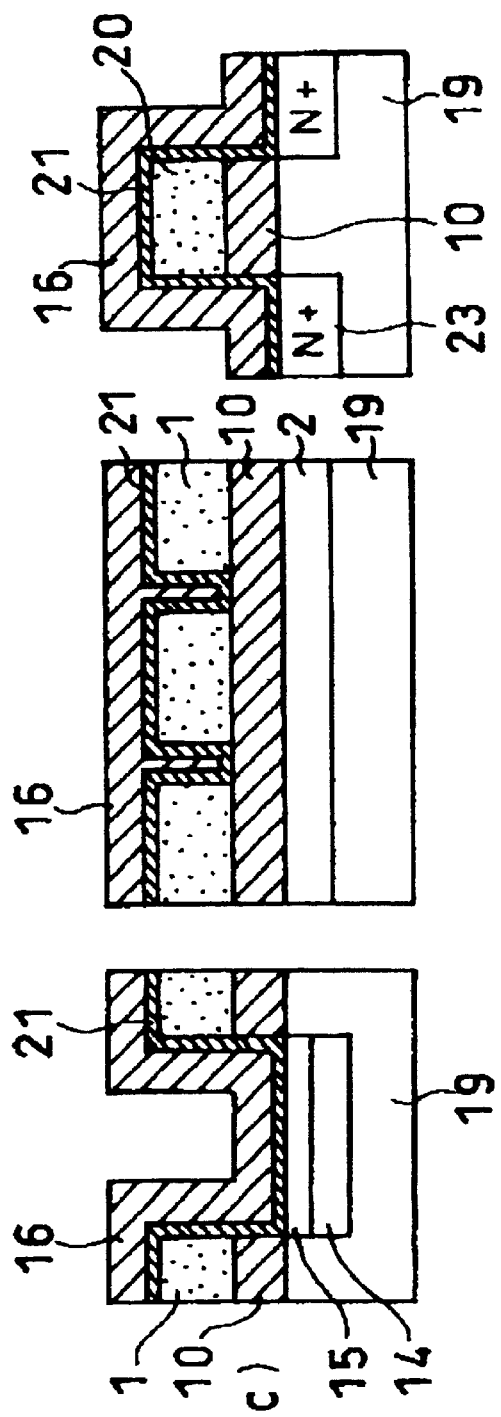

SOLID STATE IMAGE SENSOR AND METHOD FOR FABRICATING THE SAME

BACKGROUND OF THE INVENTION

The present invention relates to a solid state image sensor and a method for fabricating the same, and more specifically to a solid state image sensor having a charge transfer electrode formed by patterning a single-layer conducting electrode material film.

In the prior art, this type of solid state image sensor includes a solid state image sensor having a photoelectric conversion section formed of a buried photodiode, as shown in FIGS. 1A to 1D, which are diagrammatic sectional views for illustrating a process for fabricating the prior art solid state image sensor.

First, after a first P-type well 32 and second P-type wells 33 are formed on an N-type semiconductor substrate 31 by means of a thermal diffusion, phosphorus is ion-implanted to form a vertical charge transfer section 34. Thereafter, boron is ion-implanted to form a channel stopper region 36 and an electric charge reading region 35, as shown in FIG. 1A.

A surface of the substrate 31 thus formed is thermally oxidized to form a gate oxide film 37, and a charge transfer electrode material film 38 is deposited on the gate oxide film 37 by means of a low pressure CVD (chemical vapor deposition). Thereafter, a patterned photo resist layer 39 is formed for formation of a reading electrode, as shown in FIG. 1B.

A dry etching is carried out by using the photo resist 39 as a masks to form a charge transfer electrode 40. Phosphorus ions ($P^+$) are ion-implanted in self-alignment manner using the charge transfer electrode 40 covered with the photo resist 39, as a mask, so as to form an N-well 41, which becomes a photodiode, as shown in FIG. 1C. At this time, the photo resist 39 has a thickness of about 3 $\mu$m enough to prevent the phosphorus ions from passing through the photo resist 39.

Thereafter, in order to form a buried photodiode, the photo resist 39 is removed, and then, boron ions ($B^+$) are ion-implanted using the charge transfer electrode 40 as a mask, to form a $P^+$ region 42, as shown in FIG. 1D.

FIGS. 1A to 1D show the sectional views of the device in the course of fabricating the solid state image sensor. A layout pattern of the electrodes in a plan view becomes as shown in FIG. 2. A sectional view taken along the line B—B in FIG. 2 corresponds to the sectional view of FIGS. 1A to 1D. The layout pattern shown in FIG. 2 is disclosed in Japanese Patent Application Pre-examination Publication No. JP-A-08-293592, (an English abstract of JP-A-08-293592 is available from the Japanese Patent Office and the content of the English abstract of JP-A-08-293592 is incorporated by reference in its entirety into this application).

The transfer electrode is constituted of a plurality of polysilicon layers (two layers in the example shown in FIG. 2). The transfer electrode includes a first layer electric transfer electrode 52 and a second electric transfer electrode 53 in the form of a comb having each projection positioned on one vertical charge transfer section 51, the first layer electric transfer electrode 52 and the second electric transfer electrode 53 being located to face to each other in a plan view in such a manner that each projection of the first layer electric transfer electrode 52 overlaps on a tip end of a corresponding projection of the second electric transfer electrode 53.

Incidentally, the solid state image sensor shown in FIG. 2 has such an arrangement that two electrodes are located adjacent to each other for each one photo electric conversion section 54. In this construction, it is not possible to simultaneously read out a signal electric charge from all the photo electric conversion sections 54.

In order to simultaneously read out the signal electric charge from all the one photo electric conversion sections 54, it is necessary to arrange three electrodes adjacent to each other for each one photo electric conversion section 54. For example, the arrangement as shown in FIG. 3 is adopted. In the example shown in FIG. 3, the transfer electrode includes three layers of conducting electrode material film, namely, a first layer electric transfer electrode 62, a second layer electric transfer electrode 63 and a third layer electric transfer electrode 64. A sectional view taken along the line C—C in FIG. 3 corresponds to the sectional view of FIGS. 1A to 1D.

In the above mentioned prior art solid state image sensor, since the charge transfer electrode is constituted of a plurality of layers of conducting electrode material film, it is necessary to form a relatively thin interlayer film in order to ensure a sufficient insulation between the plurality of layers of electrode, with the result that a height of the device become high, and therefore, it becomes difficult to work. In addition, the step coverage of a light blocking or shielding film lowers, and a smear property is deteriorated.

In order to overcome the above mentioned problem, it may be considered to constitute the charge transfer electrode by a single-layer conducting electrode material film. In this case, in order to stabilize a reading characteristic for reading a signal charge from the photoelectric conversion section to the vertical charge transfer section, it is necessary to consider the plan pattern of the electrodes to form the photoelectric conversion section in self alignment to the vertical charge transfer electrode, so that when the ion-implantation is carried out for forming the photoelectric conversion section, an ion will never be implanted into a gap region between the electrodes.

BRIEF SUMMARY OF THE INVENTION

Accordingly, it is an object of the present invention to provide a solid state image sensor and a method for fabricating the same, which have overcome the above mentioned problem of the prior art.

Another object of the present invention is to provide a solid state image sensor and a method for fabricating the same, capable of preventing a positional deviation between the photoelectric conversion section and the vertical charge transfer electrode, thereby to stabilize a reading characteristic for reading a signal charge from the photoelectric conversion section to the vertical charge transfer section.

The above and other objects of the present invention are achieved in accordance with the present invention by a solid state image sensor comprising a plurality of photoelectric conversion sections formed at a surface region of a first conductivity type semiconductor layer, a charge transfer section of a second conductivity opposite to that of the first conductivity type semiconductor layer, the charge transfer section being formed in the surface region of the first conductivity type semiconductor layer, adjacent to the photoelectric conversion sections, to transfer a signal charge along the charge transfer section, a plurality of charge reading sections each formed in the surface region of the first conductivity type semiconductor layer, between a corresponding one of the photoelectric conversion sections and the charge transfer section, for reading out a signal charge generated in the corresponding photoelectric conversion section, to the charge transfer section, and tranfer electrodes formed of a single layer of conducting electrode material to cover through a gate insulator film the charge reading sections and the charge transfer section, wherein the tranfer electrodes are formed by selectively etch-removing the single layer of conducting electrode material at a plurality of first regions which divide the single layer of conducting electrode material in a row direction for each one pixel, and at a second region positioned above each of the photoelectric conversion sections, the first regions and the second region being not overlapped to each other.

According to another aspect of the present invention, there is provided a method for fabricating a solid state image sensor which comprises a plurality of photoelectric conversion sections formed at a surface region of a first conductivity type semiconductor layer, a charge transfer section of a second conductivity opposite to that of the first conductivity type semiconductor layer, the charge transfer section being formed in the surface region of the first conductivity type semiconductor layer, adjacent to the photoelectric conversion sections, to transfer a signal charge along the charge transfer section, a plurality of charge reading sections each formed in the surface region of the first conductivity type semiconductor layer, between a corresponding one of the photoelectric conversion sections and the charge transfer section, for reading out a signal charge generated in the corresponding photoelectric conversion section, to the charge transfer section, and tranfer electrodes formed of a single layer of conducting electrode material to cover through a gate insulator film the charge reading sections and the charge transfer section, the method including the steps of:

forming the single layer of conducting electrode material through the gate insulator film on a surface of the first conductivity type semiconductor layer;

etch-patterning the single layer of conducting electrode material for dividing the single layer of conducting electrode material in a row direction at a plurality of first regions;

forming a patterned mask to cover the first regions and the single layer of conducting electrode material but to expose the single layer of conducting electrode material at a second region above each of the photoelectric conversion sections;

selectively etch-removing the single layer of conducting electrode material using the patterned mask as a mask; and removing the patterned mask.

In other words the solid state image sensor in accordance with the present invention comprises the plurality of photoelectric conversion sections formed at the surface region of the first conductivity type semiconductor layer, the charge transfer section of the second conductivity opposite to that of the first conductivity type semiconductor layer, the charge transfer section being formed in the surface region of the first conductivity type semiconductor layer, adjacent to the photoelectric conversion sections, to transfer the signal charge along the charge transfer section, the plurality of charge reading sections each formed in the surface region of the first conductivity type semiconductor layer, between the corresponding one of the photoelectric conversion sections and the charge transfer section, for reading out the signal charge generated in the corresponding photoelectric conversion section, to the charge transfer section, and tranfer electrodes formed by patterning the single layer of conducting electrode material formed to cover through the gate insulator film the charge reading sections and the charge transfer section.

In the solid state image sensor in accordance with the present invention, the tranfer electrodes are formed by selectively etch-removing the single layer of conducting electrode material at the plurality of first regions which divide the single layer of conducting electrode material in the row direction for each one pixel, and at the second region positioned above each of the photoelectric conversion sections, the first regions and the second region being not overlapped to each other.

Preferably, the photoelectric conversion sections are formed in a self alignment with the second regions where the single layer of conducting electrode material has been selectively removed from a position above each of the photoelectric conversion sections.

The tranfer electrodes are applied with charge transferring pulses which have different timings, respectively.

In addition, a gate electrode in a peripheral circuit of the solid state image sensor is formed by etch-patterning the single layer of conducting electrode material so that the gate electrode in the peripheral circuit is formed in the same etching process as the second region is formed by selectively removing the single layer of conducting electrode material from a position above each of the photoelectric conversion sections.

Furthermore, the solid state image sensor in accordance with the present invention further includes a peripheral circuit including a first transistor having a gate insulator film of the same film thickness as that of the gate insulator film in the charge transfer section, and a second transistor having a gate insulator film of a film thickness thinner than as that of the gate insulator film of the first transistor, and a gate electrode of the first and second transistors in the peripheral circuit is formed by etch-patterning the single layer of conducting electrode material.

For example, the gate electrode of the second transistor is formed at the same etching process as the single layer of conducting electrode material is etch-removed at the first regions, and the gate electrode of the first transistor is formed at the same etching process as the single layer of conducting electrode material is etch-removed the second region.

As mentioned above, the method in accordance with the present invention for fabricating the solid state image sensor comprises the steps of forming the single layer of conducting electrode material through the gate insulator film on the surface of the first conductivity type semiconductor layer, etch-patterning the single layer of conducting electrode material for dividing the single layer of conducting electrode material in the row direction at the plurality of first regions, forming the patterned mask to cover the first regions and the single layer of conducting electrode material but to expose the single layer of conducting electrode material at the second region above each of the photoelectric conversion sections, selectively etch-removing the single layer of conducting electrode material using the patterned mask as the mask, and removing the patterned mask.

With this method, it is possible to fabricate the solid state image sensor which comprises the plurality of photoelectric conversion sections formed at the surface region of the first conductivity type semiconductor layer, the charge transfer section of the second conductivity opposite to that of the first conductivity type semiconductor layer, the charge transfer section being formed in the surface region of the first conductivity type semiconductor layer, adjacent to the photoelectric conversion sections, to transfer the signal charge along the charge transfer section, the plurality of charge reading sections each formed in the surface region of the first conductivity type semiconductor layer, between the corresponding one of the photoelectric conversion sections and the charge transfer section, for reading out the signal charge generated in the corresponding photoelectric conversion section, to the charge transfer section, and tranfer electrodes formed by patterning the single layer of conducting electrode material formed to cover through the gate insulator film the charge reading sections and the charge transfer section.

In the method in accordance with the present invention for fabricating the solid state image sensor, after the single layer of conducting electrode material is selectively etch-removed using the patterned mask as the mask, a first conductivity type impurity and a second conductivity type impurity are ion-implanted using the patterned mask and the single layer of conducting electrode material, or only the single layer of conducting electrode material as a mask, to form the photoelectric conversion section.

Alternatively, after the single layer of conducting electrode material is selectively etch-removed using the patterned mask as the mask, a second conductivity type impurity is ion-implanted using the patterned mask and the single layer of conducting electrode material, or only the single layer of conducting electrode material as a mask, and a first conductivity type impurity is ion-implanted into a surface region of the second conductivity type impurity region in a self alignment, using the charge transfer electrodes as a mask.

Furthermore, the second conductivity type impurity can be ion-implanted from an inclined direction, so that the second conductivity type impurity region is formed to extend under the charge transfer electrode, but in a self alignment with but separately from a transfer electrode end of the charge reading section.

In addition, the first conductivity type impurity can be ion-implanted from an inclined direction, so that the first conductivity type impurity region is formed in a self alignment with but separately from a transfer electrode end of the charge reading section.

As seen from the above, according to the present invention the charge transfer electrodes are formed by etch-patterning the single layer of conducting electrode material, which dividing an etch-removed region into a plurality of first regions which divide the single layer of conducting electrode material into a plurality of electrodes in a row direction, and a second region positioned at the photoelectric conversion section. After the second region is etch-removed, an impurity is implanted using the remaining electrodes as a mask to form for example an N-well which becomes the photoelectric conversion section. Therefore, the photoelectric conversion section and the signal charge reading electrode can be formed with no positional deviation therebetween, so that it becomes possible to stabilize a reading characteristics for reading a signal charge from the photoelectric conversion section to the vertical charge transfer section.

Thus, in the solid state image sensor having the charge transfer electrode of the single-layer structure in accordance with the present invention, the charge transfer electrode material film is deposited on the whole surface of the device, and then patterned into the charge transfer electrodes are separated from one another by the grooved separation regions, for each one pixel. Therefore, the opening for forming the photoelectric conversion section is formed in the charge transfer electrode, of the charge transfer electrodes, which also functions as a signal charge reading electrode for reading a signal charge from the photoelectric conversion section to the vertical charge transfer section, without overlapping with the grooved separation regions. Furthermore, the ions are implanted using the photo resist used for forming the opening and the charge transfer electrodes as a mask. Thus, the photoelectric conversion section and the signal charge reading electrode can be formed with no positional deviation therebetween, so that it become possible to stabilize a reading characteristic for reading a signal charge from the photoelectric conversion section to the vertical charge transfer section.

The above and other objects, features and advantages of the present invention will be apparent from the following description of preferred embodiments of the invention with reference to the accompanying drawings.

BRIEF DESCRIPTION OF THE DRAWINGS

FIGS. 11A to 11G are diagrammatic section views for illustrating the method for fabricating a fifth embodiment of the solid state image sensor in accordance with the present invention.

DETAILED DESCRIPTION OF THE INVENTION

Now, embodiments of the present invention will be described with reference to the drawings.

Figure 4:
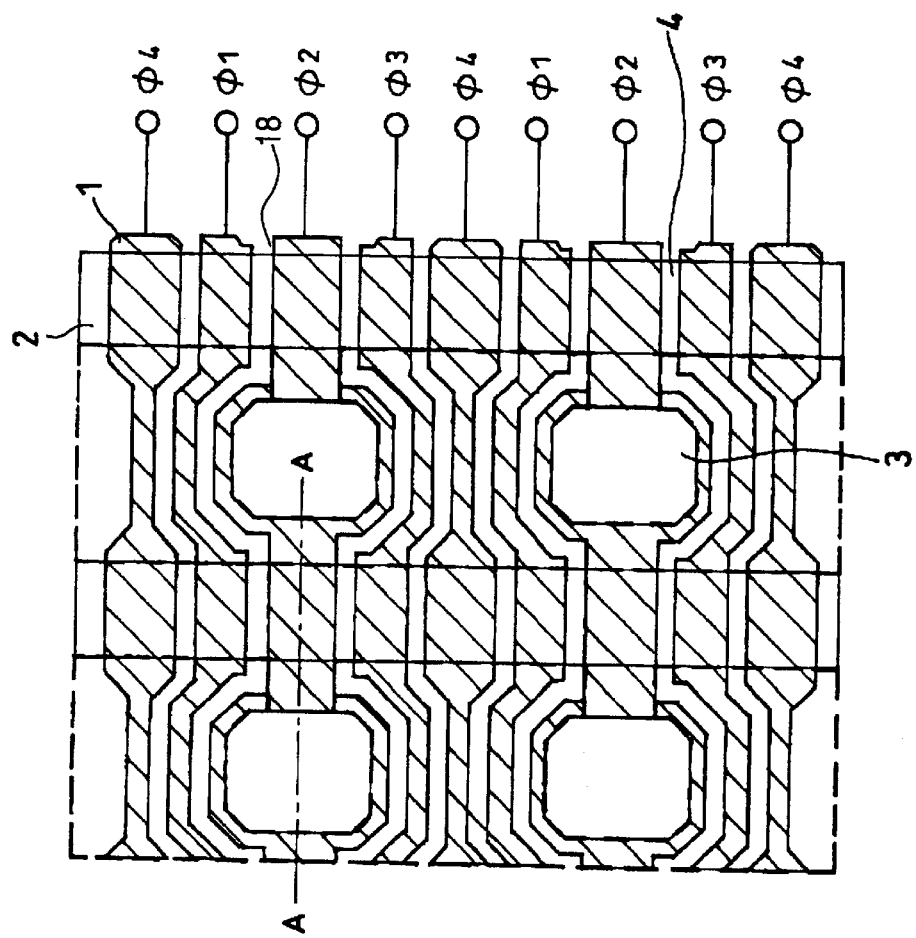
FIG. 4 is a diagrammatic plan view of a first embodiment of the solid state image sensor in accordance with the present invention.

Referring to FIG. 4, there is shown a diagrammatic plan view of a first embodiment of the solid state image sensor in accordance with the present invention, which includes a photoelectric conversion section formed of a buried photodiode.

In the embodiment of the solid state image sensor in accordance with the present invention, a charge transfer electrode is constituted of a single-layer polysilicon. The solid state image sensor in accordance with the present invention is characterized in that when an etching is carried out for patterning a charge transfer electrode 1, an etching region is divided into grooved separation regions 4 for dividing the charge transfer electrode in a row direction, and regions each located on a photoelectric conversion section. After the etching is carried out in the regions each located o the photoelectric conversion section 3, phosphorus is ion-implanted to form an N-well which becomes the photoelectric conversion section 3, so that the charge reading electrodes and the photoelectric conversion sections 3 are formed in a self-alignment. Incidentally, a light blocking or shielding metal film for preventing incidence of the light to a vertical charge transfer section 2, is omitted for simplification of the drawing. In FIG. 4, in addition, reference signs φ1 to φ4 indicate individual electrodes of the charge transfer electrode, respectively.

Now, an embodiment of the method for fabricating the first embodiment of the solid state image sensor will be described with reference to FIGS. 5A to 5E which are diagrammatic section views taken along the line A—A in FIG. 4, for illustrating an embodiment of the method for fabricating the first embodiment of the solid state image sensor, and FIGS. 6A to 6D which are diagrammatic plan views of the solid state image sensor, for illustrating the method for fabricating the first embodiment of the solid state image sensor. The section view taken along the line A—A in FIG. 4 is a section crossing a charge transfer electrode 18 which also functions as a signal charge reading electrode for reading a signal charge from the photoelectric conversion section 3 to the vertical charge transfer section 2.

First, after a first P-type well 6 and second P-type wells 7 are formed on an N-type semiconductor substrate 5 by means of a thermal diffusion, phosphorus is ion-implanted to form the (N-type) vertical charge transfer section 2. Thereafter, boron is ion-implanted to form a channel stopper region 9 and an electric charge reading region 8 for reading a signal generated in the photoelectric conversion section 3 to the vertical charge transfer section 2, as shown in FIG. 5A.

Figure 5A:
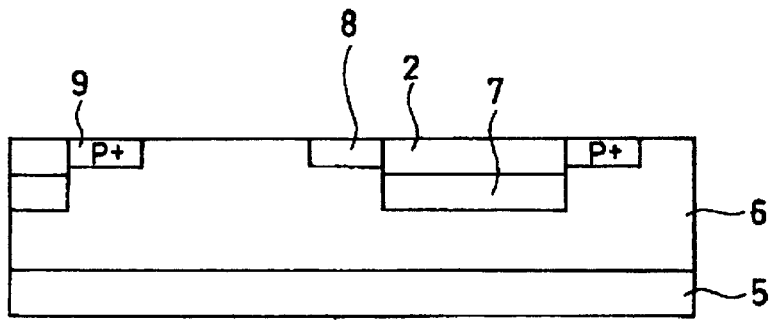
FIGS. 5A to 5E are diagrammatic section views taken along the line A—A in FIG. 4, for illustrating an embodiment of the method for fabricating the solid state image sensor.
Figure 6A:
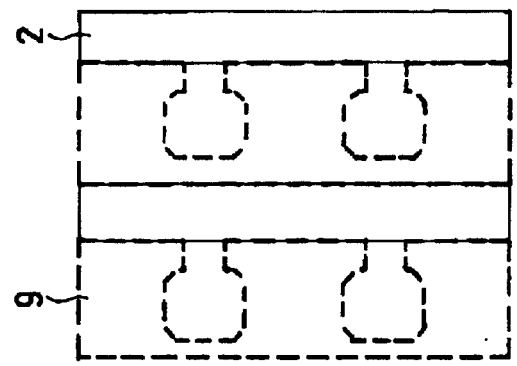
FIGS. 6A to 6D are diagrammatic plan views of the first embodiment of the solid state image sensor, for illustrating the method for fabricating the solid state image sensor.
Figure 6B:
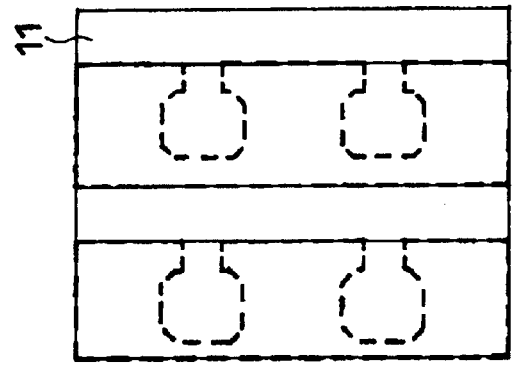

FIG. 6A corresponds to FIG. 5A. As shown in FIG. 6A, the channel stopper region 9 is formed to separate the photoelectric conversion section 3 and the vertical charge transfer section 2 from each other.

Figure 5B:
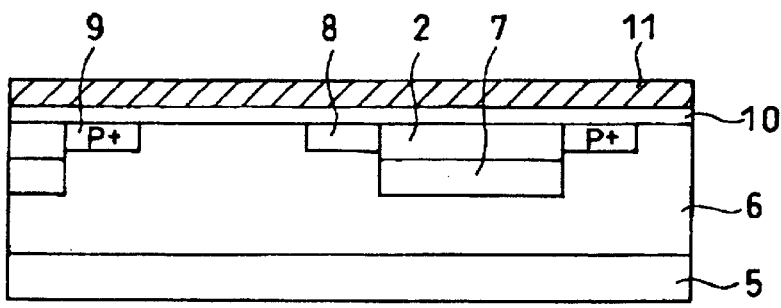

A surface of the substrate 5 thus formed is thermally oxidized to forma gate oxide film 10, and a charge transfer electrode material film 11 formed of polysilicon, is deposited on the gate oxide film 10 by means of a low pressure CVD (chemical vapor deposition), a shown FIG. 5B. At this time, the plan pattern becomes a shown in FIG. 6B.

Figure 6C:
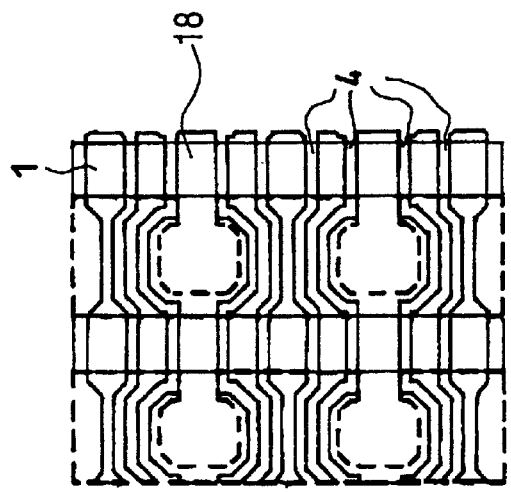
Figure 6D:
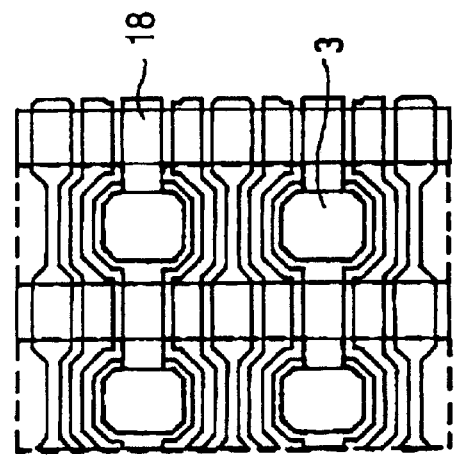

Thereafter, the charge transfer electrode material film 11 is patterned to form a charge transfer electrode 1 divided by grooved separation regions 4. The plan pattern obtained at this time becomes as shown FIG. 6C. In this embodiment, it is intended to realize a solid state image sensor capable of simultaneously reading out from all pixels. For this purpose, as shown in FIG. 6C, four charge transfer electrodes are provided adjacent to each other, for each one pixel (namely, each one photoelectric conversion section 3). Therefore, four grooved separation regions 4 for dividing, in the row direction, the polysilicon film 11 which becomes the charge transfer electrode 1, are provided for each one pixel.

A patterned photo resist 13 is formed on the charge transfer electrode 18 which also functions as the signal charge reading electrode, and by means of a dry etching using the patterned photo resist 13 as a mask, an opening 12 is formed through the charge transfer electrode 18 which also functions as the signal charge reading electrode, at a position above the photoelectric conversion section 3.

Figure 5C:
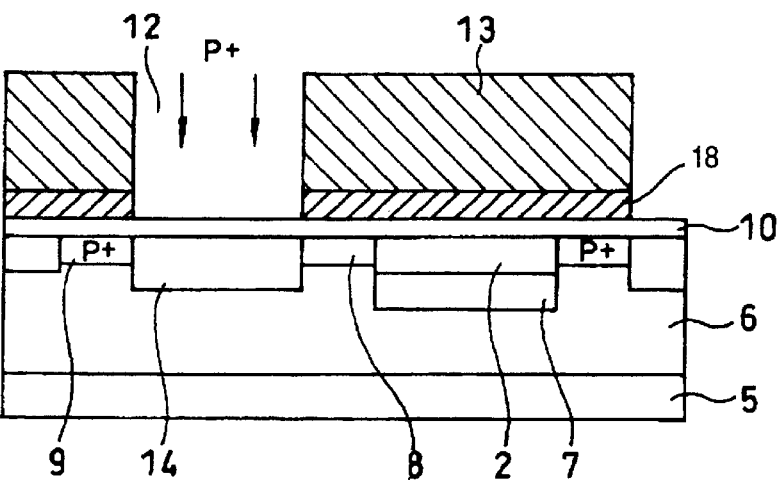

Furthermore, phosphorus ions ($P^+$) are ion-implanted using the patterned photo resist 13 and the charge transfer electrode 1, as a mask, so as to form an N-well 14, which becomes the photoelectric conversion section 3, as shown in FIG. 5C. At this time, the plan pattern becomes as shown FIG. 6D. In addition, the photo resist 13 has a thickness of about 3 μm enough to prevent the phosphorus ions from passing through the photo resist 13.

Figure 5D:
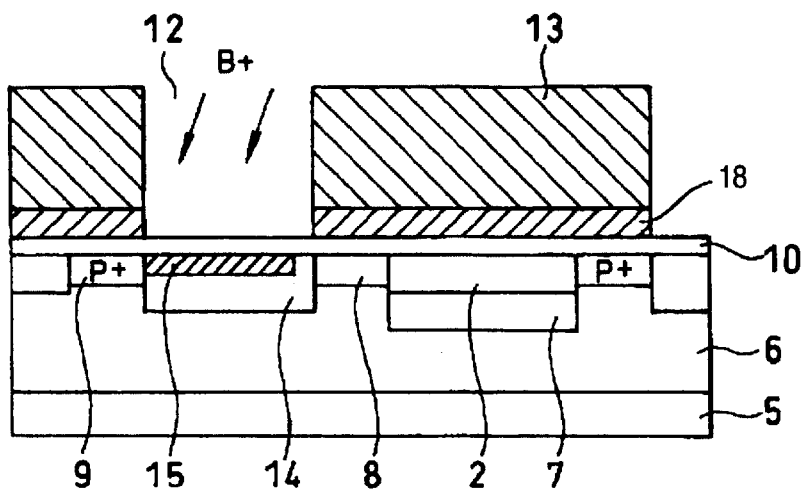

Thereafter, in order to form a buried photodiode, boron ions ($B^+$) are ion-implanted using the photo resist 13 and the charge transfer electrode 1 as a mask, to form a $P^+$ region 15, as shown in FIG. 5D.

Figure 5E:
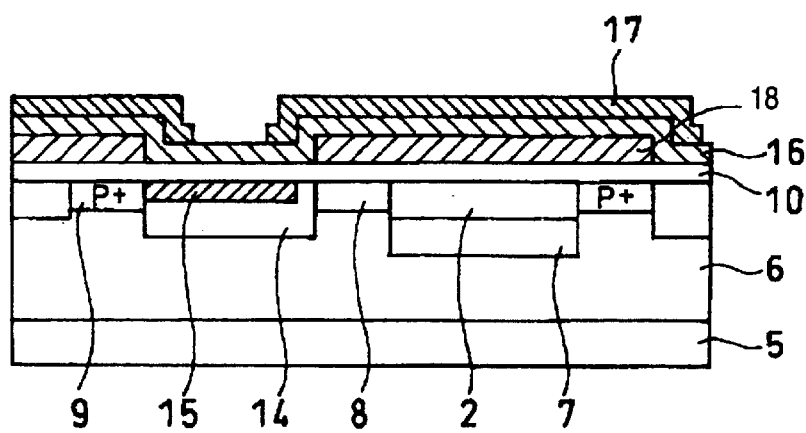

Furthermore, an interlayer insulator film 16 is formed, and a light blocking or shielding metal film 17 is formed on the interlayer insulator film 16 to cover a region other than the photoelectric conversion section 3, as shown in FIG. 5E. Thus, the first embodiment of the solid state image sensor in accordance with the present invention is obtained.

In the first embodiment of the solid state image sensor in accordance with the present invention, when the single layer 11 of conducting electrode material film is etch-patterned to form the charge transfer electrodes 1 including the charge transfer electrode 18 which also functions as the signal charge reading electrode, the region to be etch-removed is divided into two regions, namely, the first regions 4 for dividing the charge transfer electrode 1 in the row direction, and a second region positioned on the photoelectric conversion section 3, so that after the second region is etch-removed, the phosphorus ions ($P^+$) are ion-implanted to form the N-well 14, which becomes the photoelectric conversion section 3. With this procedure, it is possible to prevent a positional deviation between the photoelectric conversion section 3 and the charge transfer electrode, thereby to stabilize a reading characteristic for reading a signal charge from the photoelectric conversion section 3 to the vertical charge transfer section 2.

Furthermore, since the grooved first regions 4 for dividing the charge transfer electrode 1 in the row direction, are etched prior to the etching for forming the opening 12, a photolithography can be carried out in a condition that the charge transfer electrode material film 11 has a good planar property, with the result that fine regions can be patterned with a high degree of precision.

Furthermore, since the grooved first regions 4 for dividing the charge transfer electrode 1 which occupies a large area in a wafer surface, in the row direction, are etched prior to the etching for forming the opening 12, a charge-up amount of the charge transfer electrode material film 11 attributable to an antenna effect at an etching time, is reduced, so that it is possible to reduce a damage to the gate oxide film 10. In this case, the fact that the area of the remaining charge transfer electrode material film 11 is small, means that the antenna effect, namely, a portion acting as a charge collecting means, is reduced.

Moreover, since the charge transfer electrode 1 is formed by etch-patterning the single layer of conducting electrode material film (charge transfer electrode material film 11), no overlapping exists between electrodes, with the result that there is no problem in connection with an interlayer insulation between electrodes, and therefore, an interlayer capacitance is small.

Figure 7:
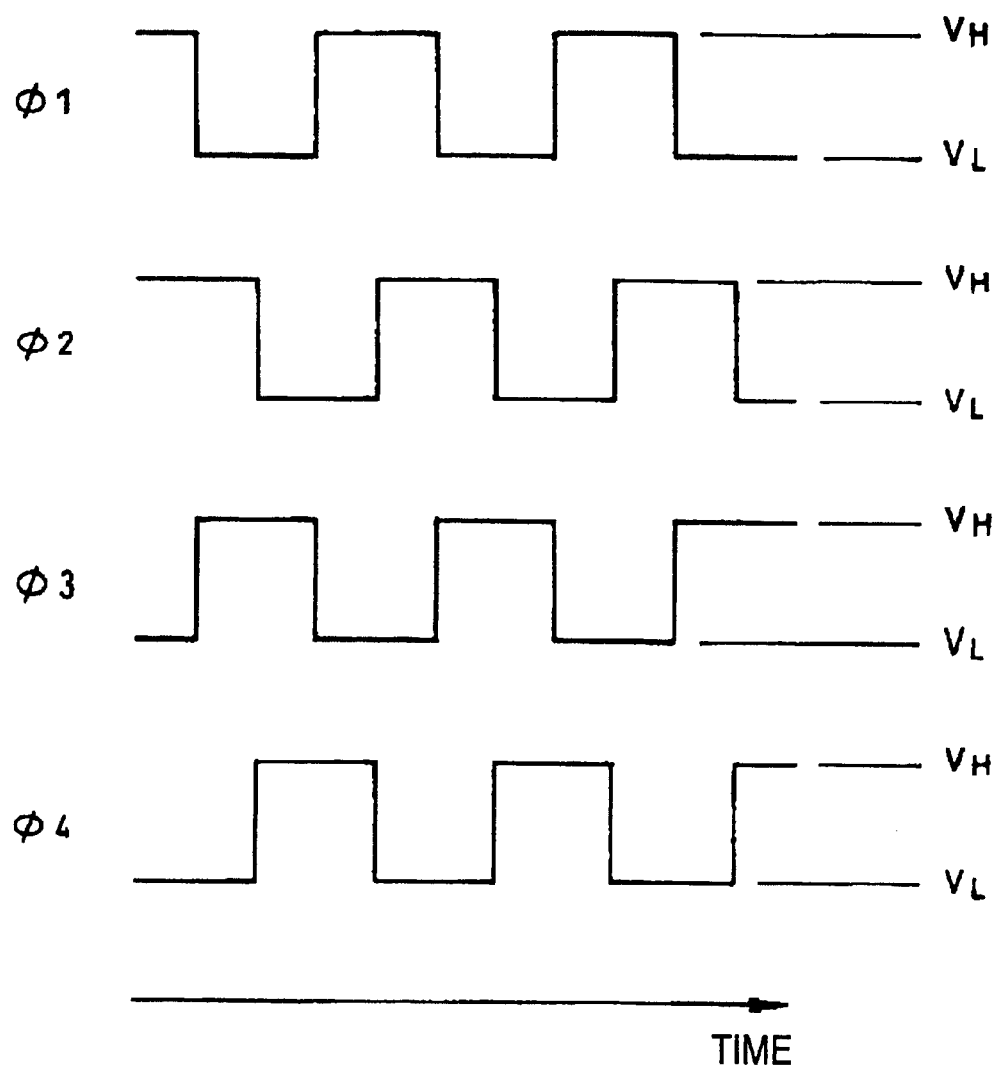
FIG. 7 is a timing chart illustrating charge transferring pulses applied to the first embodiment of the solid state image sensor in accordance with the present invention.

Referring to FIG. 7, there is shown is a timing chart illustrating charge transferring pulses applied to the first embodiment of the solid state image sensor in accordance with the present invention. In FIG. 7, φ1 to φ4, indicate charge transferring pulses applied to the individual electrodes φ1 to φ4, respectively. In this embodiment, charge transferring pulses which are different in phase by each 90 degrees, are supplied to the individual electrodes φ1 to φ4 of the charge transfer electrode 1, so that an electric potential under the individual electrodes φ1 to φ4 are changed to transfer the signal charge in the vertical direction.

In this process, the signal charge is transferred and accumulated under the transfer electrode applied with a high level voltage $V_H$, from under the transfer electrode applied with a low level voltage $V_L$. Therefore, as seen from FIG. 7, adjacent individual electrodes φ1 to φ4 formed of the single-layer charge transfer electrode material film 11 are applied with the pulses at respective different timings. In the solid stage image sensor shown in FIG. 4, the charge transfer is realized in a four-phase driving.

Figure 8:
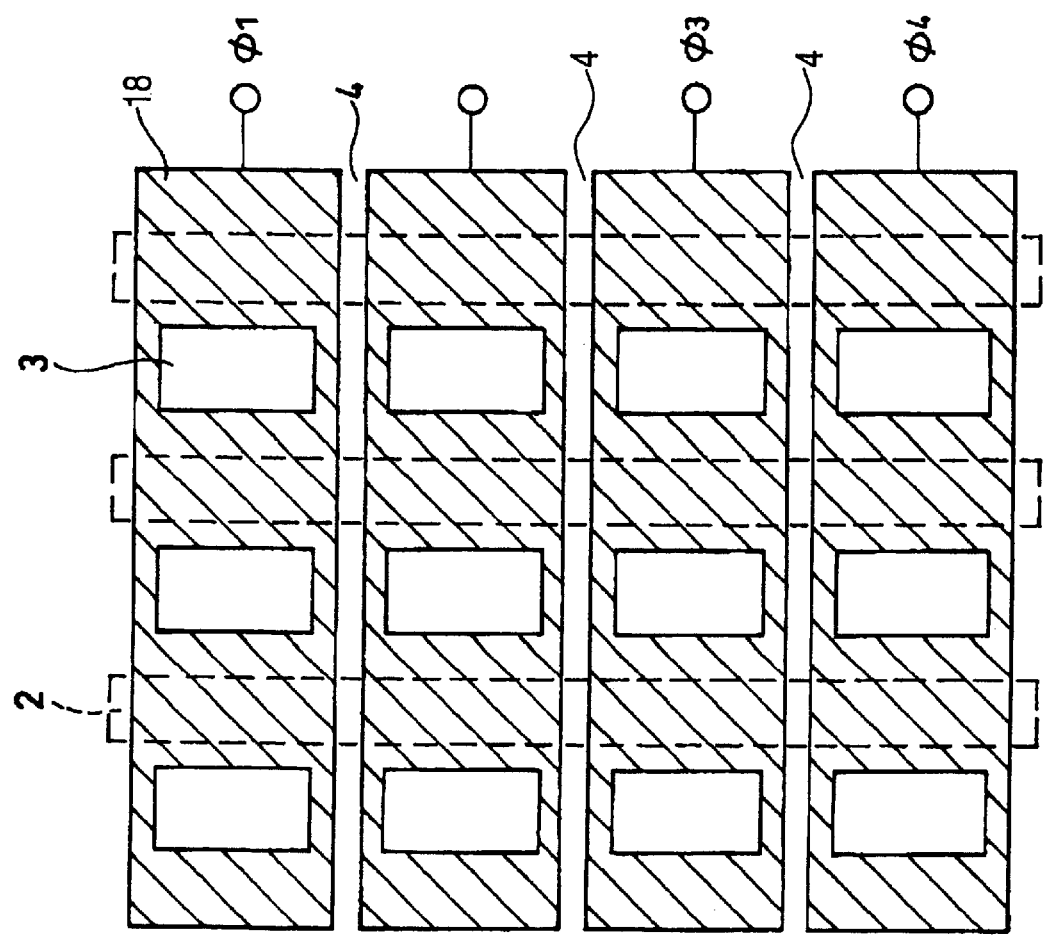
FIG. 8 is a plan view of a second embodiment of the solid state image sensor in accordance with the present invention.

Referring to FIG. 8, there is shown a plan view of a second embodiment of the solid state image sensor in accordance with the present invention, which includes a photoelectric conversion section formed of a buried photodiode.

In this embodiment of the solid state image sensor in accordance with the present invention, a charge transfer electrode 1 is constituted of a single-layer polysilicon film. When an etching is carried out for patterning the charge transfer electrode 1, an etching region is divided into grooved separation regions 4 for dividing the charge transfer electrode in a row direction, and regions each located on a photoelectric conversion section 3. After the etching is carried out in the regions each located on the photoelectric conversion section 3, phosphorus is ion-implanted to form an N-well (not shown) which becomes the photoelectric conversion section 3, so that the charge reading electrodes and the photoelectric conversion sections 3 are formed in a self-alignment. The second embodiment shown in FIG. 8 can be driven with the charge transfer pulses φ1 to φ4 as shown in FIG. 7.

Figure 9:
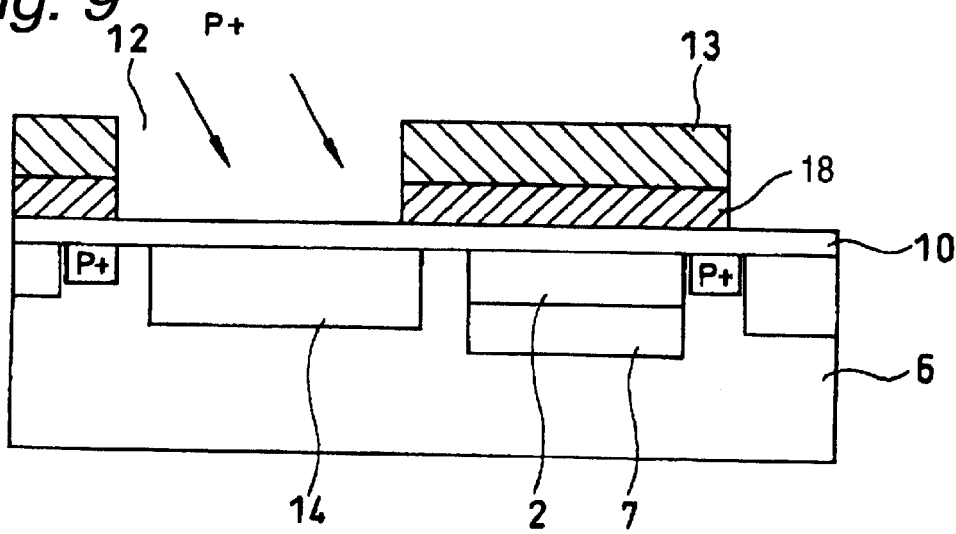
FIG. 9 is a diagrammatic section view of a third embodiment of the solid state image sensor in accordance with the present invention.

Referring to FIG. 9, there is shown a diagrammatic section view of a third embodiment of the solid state image sensor in accordance with the present invention. The shown embodiment includes a photoelectric conversion section formed of a buried photodiode.

A method for fabricating the third embodiment of the solid state image sensor in accordance with the present invention, will be described with reference to FIG. 9. The method for fabricating the third embodiment of the solid state image sensor in accordance with the present invention, is the same as those of the method for fabricating the third embodiment of the solid state image sensor, until the steps shown in FIGS. 5B and 6C where there are formed the regions 4 for dividing the polysilicon film 11 which becomes the charge transfer electrode 1, in the row direction.

Thereafter, a patterned photo resist 13 is formed on the charge transfer electrode 18 which also functions as the signal charge reading electrode, and by means of a dry etching using the patterned photo resist 13 as a mask, an opening 12 is formed through the charge transfer electrode 18 which also functions as the signal charge reading electrode, at a position above the photoelectric conversion section 3.

Furthermore, by an ion implantation using the patterned photo resist 13 and the charge transfer electrode 1, as a mask, phosphorus ions ($P^+$) are ion-implanted from an inclined direction which causes the implanted ions to extend under the charge reading electrode, so as to form an N-well 14, which becomes the photoelectric conversion section 3, as shown in FIG. 9.

Thereafter, in order to form a buried photodiode, boron ions ($B^+$) are ion-implanted using the photo resist 13 and the charge transfer electrode 1 as a mask, to form a $P^+$ region 15 (which is not shown in FIG. 9 but corresponds to the $P^+$ region 15 shown in FIG. 5D).

Furthermore, an interlayer insulator film 16 (not shown in FIG. 9) is formed, and a light blocking or shielding metal film 17 (not shown in FIG. 9) is formed on the interlayer insulator film 16 to cover a region other than the photoelectric conversion section 3. Since these steps are the same as those shown in FIGS. 5D and 5E, a drawing is omitted. Thus, the third embodiment of the solid state image sensor in accordance with the present invention is obtained.

In the third embodiment of the solid state image sensor in accordance with the present invention, the N-well 14 of the photoelectric conversion section 3 extends under the charge reading electrode. Therefore, when the signal charge is read out from the photoelectric conversion section 3 to the vertical charge transfer section 2, no potential barrier occurs at a region where the charge reading electrode is spatially contacted to the photoelectric conversion section 3, with the result that it is possible to reduce the voltage for reading the signal charge.

Figure 10:
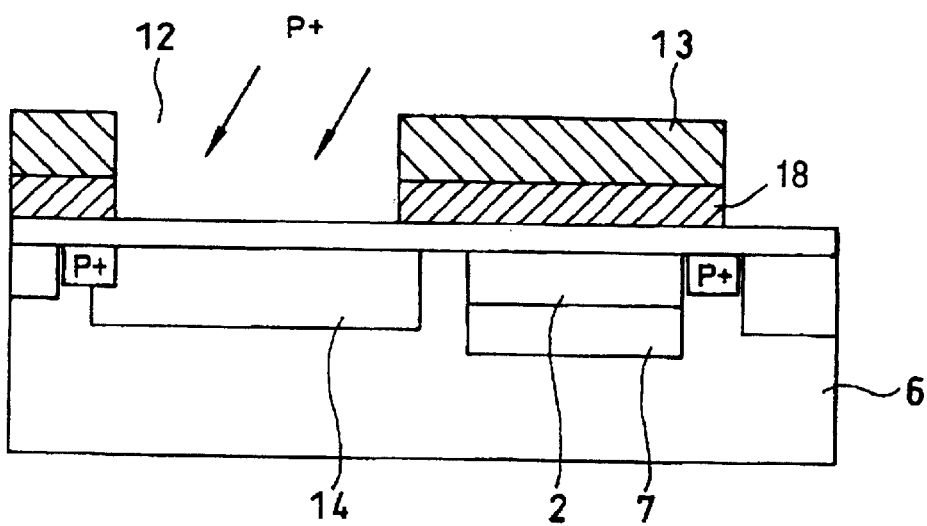
FIG. 10 is a diagrammatic section view of a fourth embodiment of the solid state image sensor in accordance with the present invention.

Referring to FIG. 10, there is shown a diagrammatic section view of a fourth embodiment of the solid state image sensor in accordance with the present invention. The shown embodiment includes a photoelectric conversion section formed of a buried photodiode.

A method for fabricating the fourth embodiment of the solid state image sensor in accordance with the present invention, will be described with reference to FIG. 10. The method for fabricating the fourth embodiment of the solid state image sensor in accordance with the present invention, is the same as those of the method for fabricating the third embodiment of the solid state image sensor, until the steps shown in FIGS. 5B and 6C where there are formed the regions 4 for dividing the polysilicon film 11 which becomes the charge transfer electrode 1, in the row direction.

Thereafter, a patterned photo resist 13 is formed on the charge transfer electrode 18 which also functions as the signal charge reading electrode, and by means of a dry etching using the patterned photo resist 13 as a mask, an opening 12 is formed through the charge transfer electrode 18 which also functions as the signal charge reading electrode, at a position above the photoelectric conversion section 3.

Furthermore, similarly to the third embodiment shown in FIG. 9, by an ion implantation using the patterned photo resist 13 and the charge transfer electrode 1, as a mask, phosphorus ions ($P^+$) are ion-implanted from an inclined direction which causes the implanted ions to extend under the charge reading electrode, so as to form an N-well 14, which becomes the photoelectric conversion section 3, as shown in FIG. 9.

Thereafter, phosphorus ions ($P^+$) are further ion-implanted from an opposite inclined direction which causes the implanted ions to extend under the side of the transfer electrode opposite to the charge reading electrode, so that an N-well 14 is formed as shown in FIG. 10, which becomes the photoelectric conversion section 3.

After this step, the steps similar to the first embodiment are carried out. Thus, the fourth embodiment of the solid state image sensor in accordance with the present invention is obtained.

In this fourth embodiment, after the phosphorus ions (P$^+$) are ion-implanted from the inclined direction as shown in FIG. 9, since the phosphorus ions (P$^+$) are further ion-implanted from the opposite inclined direction as shown in FIG. 10, the photoelectric conversion section 3 can be expanded so that the signal charge amount accumulated in the photoelectric conversion section 3 can be increased.

Referring to FIGS. 11A to 11G, there are shown diagrammatic section views for illustrating the method for fabricating a fifth embodiment of the solid state image sensor in accordance with the present invention. The shown embodiment includes a photoelectric conversion section formed of a buried photodiode and has a charge transfer electrode of a single-layer electrode structure. In FIGS. 11A to 11G, a photoelectric conversion section 3, a charge transfer section 2 and a transistor section of a peripheral circuit are shown in a divided form for convenience of the drawing.

Now, the method for fabricating the fifth embodiment of the solid state image sensor in accordance with the present invention will be described with reference to FIGS. 11A to 11G.

Figure 11A:
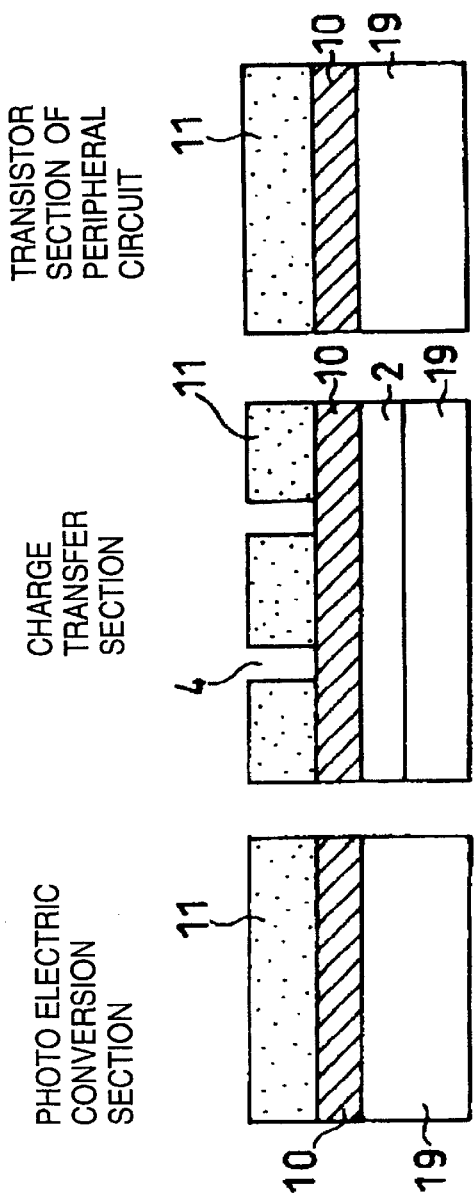

FIG. 11A shows a condition that a single-layer charge transfer electrode material film 11 is deposited on a gate oxide film 10.

First, after a first P-type well 6 and second P-type wells 7 are formed on an N-type semiconductor substrate 5 by means of a thermal diffusion, phosphorus is ion-implanted to form the vertical charge transfer section 2. Thereafter, boron is ion-implanted to form a channel stopper region 9 and an electric charge reading region 8. The substrate in this condition will be called a P-type semiconductor substrate 19, hereinafter.

Figure 1A:
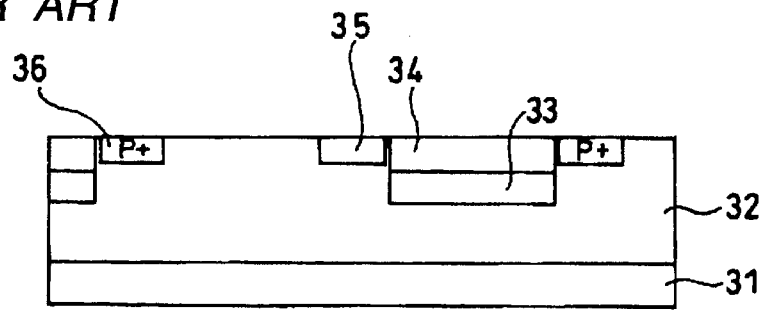
FIGS. 1A to 1D are diagrammatic section view of the prior art solid state image sensor having a photoelectric conversion section formed of a buried photodiode.
Figure 1B:
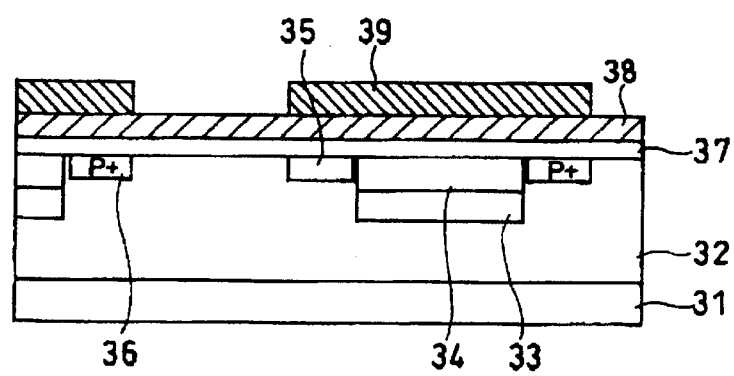
Figure 1C:
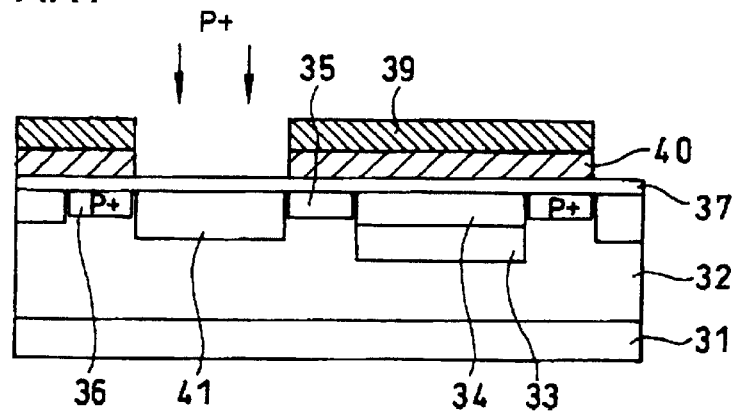
Figure 1D:
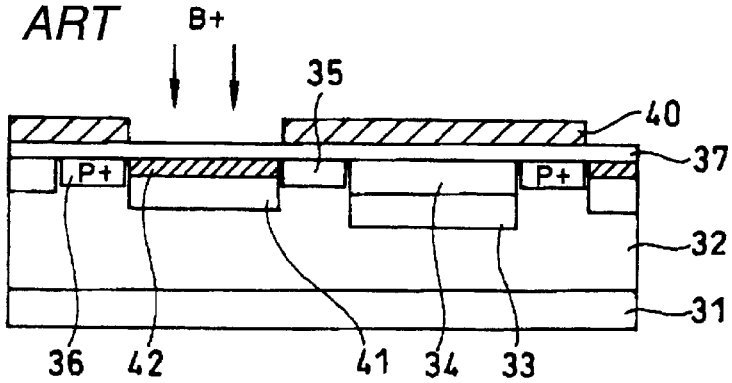
Figure 2:
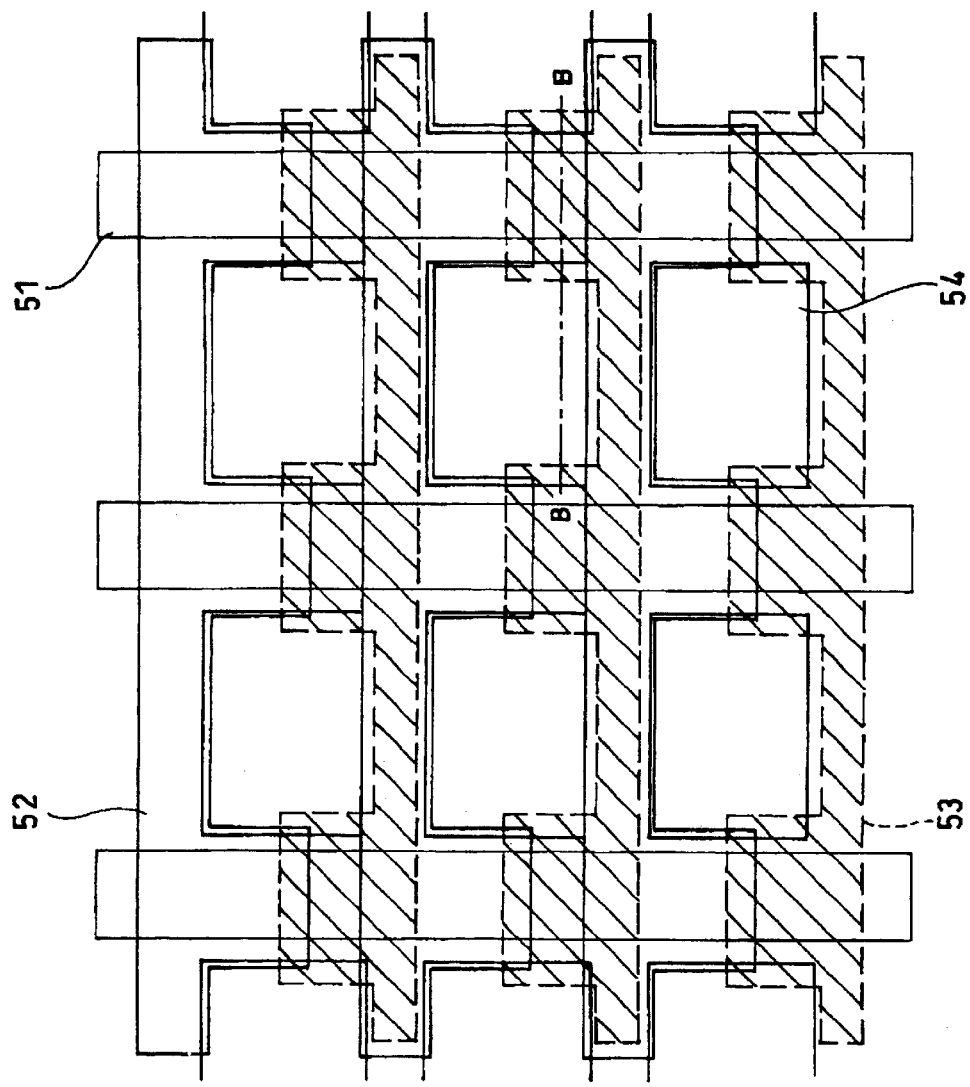
FIG. 2 is a diagrammatic plan view illustrating the layout pattern of the two-layer charge transfer electrode in the prior art solid state image sensor.
Figure 3:
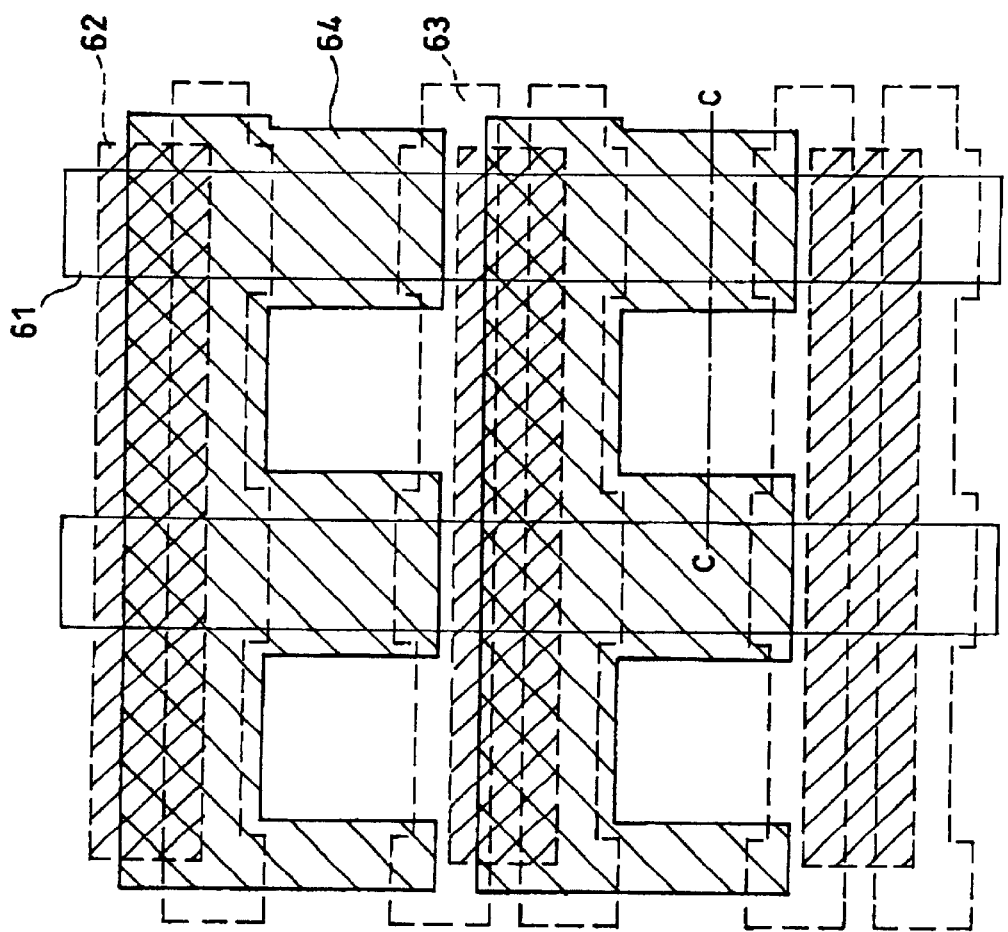
FIG. 3 is a diagrammatic plan view illustrating the layout pattern of the three-layer charge transfer electrode in the prior art solid state image sensor.

A surface of the P-type semiconductor substrate 19 is thermally oxidized to form a gate oxide film 10, and a charge transfer electrode material film 11 formed of polysilicon, is deposited on the gate oxide film 10 by means of a low pressure CVD (chemical vapor deposition), as shown in FIG. 2B. Thereafter, the charge transfer electrode material film 11 is patterned and divided into individual charge transfer electrodes ($\phi1$ to $\phi4$) 1 which are separated from one another by grooved separation regions 4, which is clearly shown in the charge transfer section 2 in FIG. 11A.

Figure 11B:
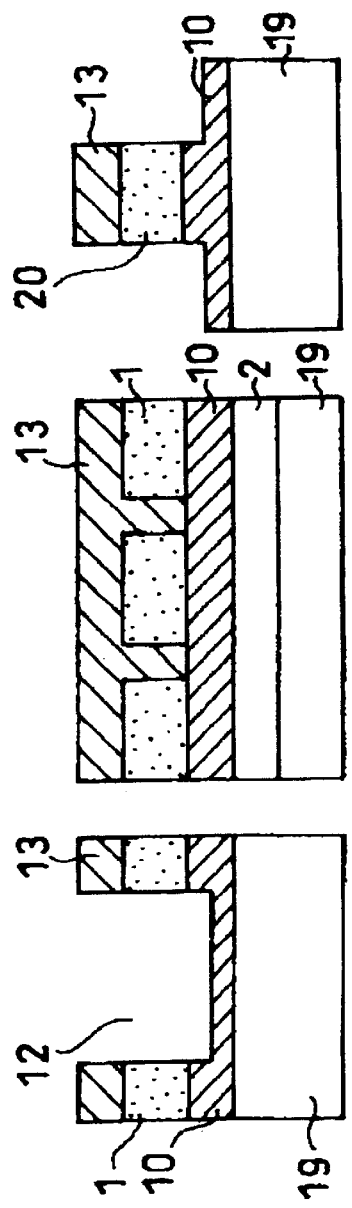

A patterned photo resist 13 is formed on the charge transfer electrode material film 11, and by means of a dry etching using the patterned photo resist 13 as a mask, an opening 12 is formed through the charge transfer electrode (designated with the reference number 1 in the photoelectric conversion section in FIG. 11B) which also functions as the signal charge reading electrode, at a position above the photoelectric conversion section 3, as shown in FIG. 11B. At this time, a gate electrode 20 is simultaneously etched in the transistor section of the peripheral circuit. Furthermore, the gate oxide film 10 is etched to a desired thickness.

Furthermore, phosphorus ions (P$^+$) are ion-implanted using the patterned photo resist 13 and the charge transfer electrode 1, as a mask, so as to form an N-well 14, which becomes the photoelectric conversion section 3, as shown in FIG. 11C. At this time, source/drain regions (designated with the reference number 14 in the transistor section of the peripheral circuit in FIG. 11C) are simultaneously formed in the transistor section of the peripheral circuit.

Thereafter, in order to form a buried photodiode, boron ions (B$^+$) are ion-implanted using the photo resist 13 and the charge transfer electrode 1 as a mask, to form a P$^+$ region 15, as shown in FIG. 11D. At this time, the boron ions are simultaneously implanted into the source/drain regions (as designated with the reference number 15 in the transistor section of the peripheral circuit in FIG. 11D).

Figure 11E:
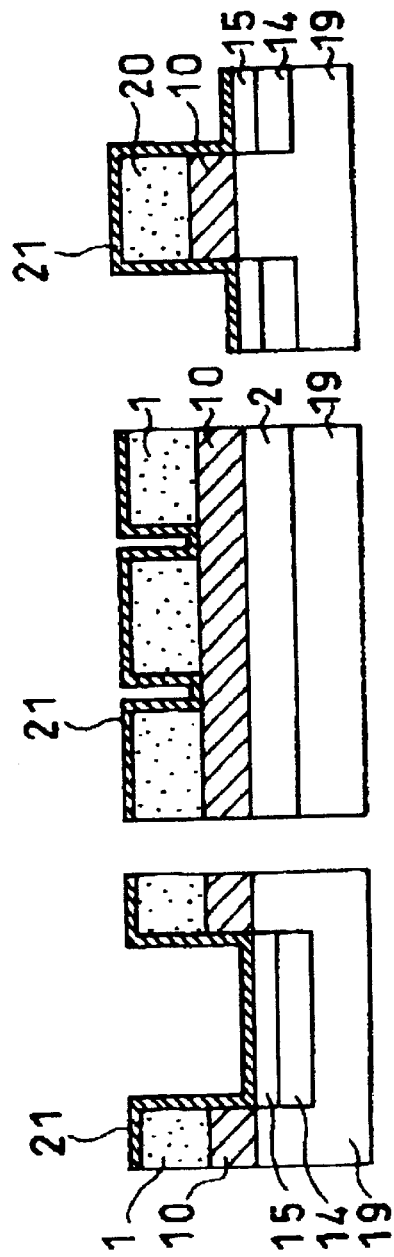

All of the gate oxide film 10 exposed in the photoelectric conversion section 3 and the peripheral circuit are removed by an etching, and the whole of the device is thermally oxidized to form an oxide film 21 to cover the whole of the device, as shown in FIG. 11E.

Figure 11F:
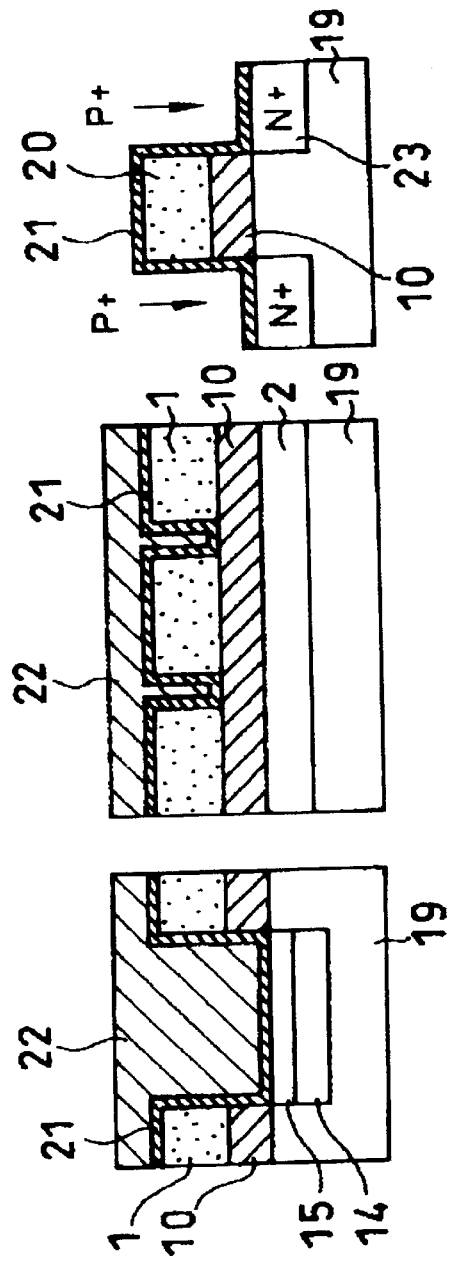

Succeedingly, in order to form N$^+$ regions which become source/drain regions in the transistor section of the peripheral circuit, a patterned photo resist 22 is formed to cover the photoelectric conversion section 3 and the charge transfer section 2, and for example, phosphorus ions (P$^+$) are ion-implanted using the patterned photo resist 22 and the gate electrode 20, as a mask, so that N$^+$ diffused regions 23 are formed at opposite sides of the gate electrode 20 as shown in FIG. 11F.

In this process, when the N-well 14 and the P$^+$ region 15 are formed in the photoelectric conversion section 3, the source/drain regions are already ion-implanted. However, since the dose for forming the N$^+$ diffused regions 23 is far larger than the doses for forming the N-well 14 and the P$^+$ region 15, particularly, the dose of boron for forming the P$^+$ region 15, the N$^+$ diffused regions 23 can be sufficiently formed.

Thereafter, the patterned photo resist 22 is removed, and an interlayer insulator film 16 is formed as shown in FIG. 11G, and a light blocking or shielding metal film (not shown) is formed on the interlayer insulator film 16 to cover a region other than the photoelectric conversion section 3, as shown in FIG. 5E. Thus, the fifth embodiment of the solid state image sensor in accordance with the present invention is obtained.

In the fifth embodiment of the solid state image sensor in accordance with the present invention, the gate electrode 20 is patterned by the etching in the transistor section of the peripheral circuit at the same time as the opening 12 is etched to penetrate through the charge transfer electrode in the photoelectric conversion section 3, and furthermore, after the charge transfer electrode material film 11 in the photoelectric conversion section 3 and the peripheral circuit is patterned by the etching, the gate oxide film 10 is etched to the desired thickness. Therefore, it is possible to control the immersing depth of the implanted ions so that the photoelectric conversion sections 3 and the N$^+$ diffused regions 23 can easily formed.

Referring to FIGS. 12A to 12G, there are shown diagrammatic section views for illustrating the method for fabricating a sixth embodiment of the solid state image sensor in accordance with the present invention. The shown embodiment includes a photoelectric conversion section formed of a buried photodiode and has a charge transfer electrode of a single-layer electrode structure. In FIGS. 12A to 12G, a photoelectric conversion section 3, a charge transfer section 2 and a transistor section of a peripheral circuit are shown in a divided form for convenience of the drawing. Furthermore, the transistor section of the peripheral circuit includes a transistor having a gate oxide film having a thin film thickness for elevating a current gain.

Now, the method for fabricating the sixth embodiment of the solid state image sensor in accordance with the present invention will be described with reference to FIGS. 12A to 12G.

Figure 12A:
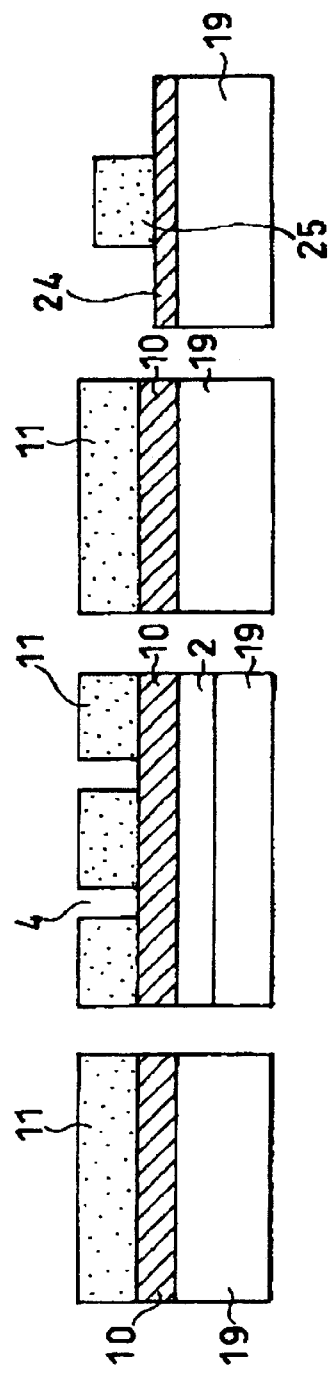
FIGS. 12A to 12G are diagrammatic section views for illustrating the method for fabricating a sixth embodiment of the solid state image sensor in accordance with the present invention.

FIG. 12A shows a condition that a single-layer charge transfer electrode material film 11 is deposited on a gate oxide film 10.

First, after a first P-type well 6 and second P-type wells 7 are formed on an N-type semiconductor substrate 5 by means of a thermal diffusion, phosphorus is ion-implanted to form the vertical charge transfer section 2. Thereafter, boron is ion-implanted to form a channel stopper region 9 and an electric charge reading region 8. The substrate in this condition will be called a P-type semiconductor substrate 19, hereinafter.

A surface of the P-type semiconductor substrate 19 is thermally oxidized to form a gate oxide film 10, and a charge transfer electrode material film 11 formed of polysilicon, is deposited on the gate oxide film 10 by means of a low pressure CVD (chemical vapor deposition), as shown in FIG. 2B. Thereafter, the charge transfer electrode material film 11 is patterned and divided into individual charge transfer electrodes ($\phi 1$ to $\phi 4$) 1 which are separated from one another by grooved separation regions 4, which is clearly shown in the charge transfer section 2 in FIG. 12A. In the transistor section of the peripheral circuit, at this time, a gate electrode 25 is simultaneously patterned by an etching in a transistor having a thin gate oxide film 24, as shown in FIG. 12A.

Figure 12B:
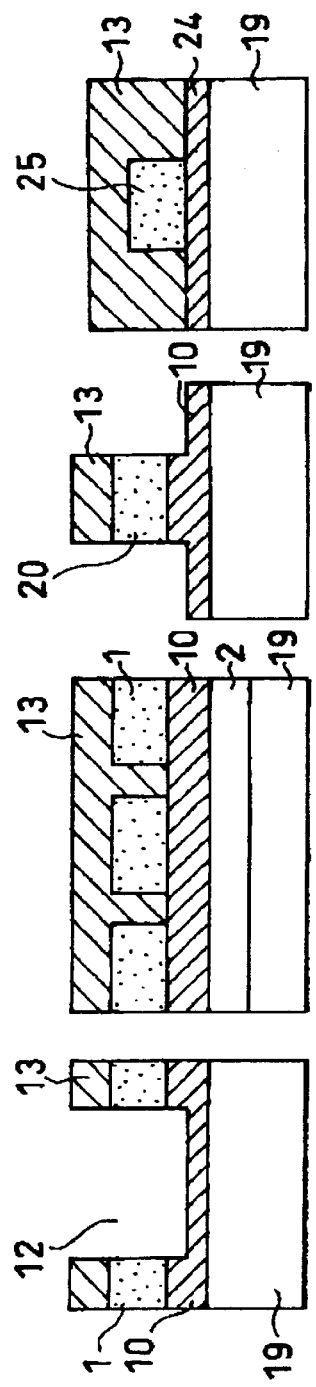

A patterned photo resist 13 is formed on the charge transfer electrode material film 11, and by means of a dry etching using the patterned photo resist 13 as a mask, an opening 12 is formed through the charge transfer electrode (designated with the reference number 1 in the photoelectric conversion section in FIG. 12B) which also functions as the signal charge reading electrode, at a position above the photoelectric conversion section 3, as shown in FIG. 12B. In the transistor section of the peripheral circuit, at this time, a gate electrode 20 is simultaneously etched in a transistor section having the gate oxide film having the same thickness as that of the oxide film 10 on the charge transfer section 2, as shown in FIG. 12B. Furthermore, the gate oxide film 10 is etched to a desired thickness.

Figure 12C:
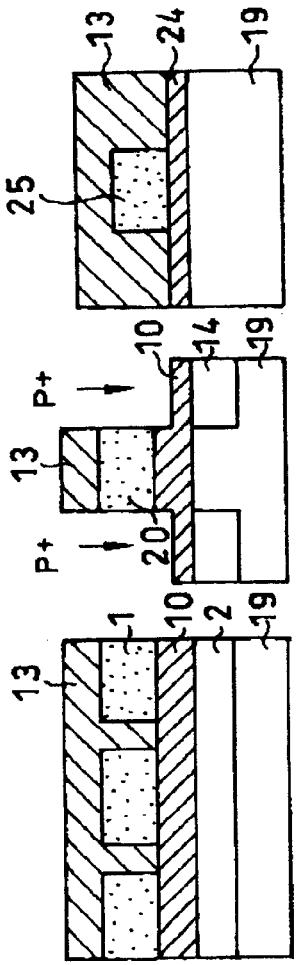

Furthermore, phosphorus ions ($P^+$) are ion-implanted using the patterned photo resist 13 and the charge transfer electrode 1, as a mask, so as to form an N-well 14, which becomes the photoelectric conversion section 3, as shown in FIG. 12C. At this time, source/drain regions (designated with the reference number 14 in the transistor section of the peripheral circuit in FIG. 12C) are simultaneously formed in the transistor section having the gate oxide film having the same thickness as that of the oxide film 10 on the charge transfer section 2.

Figure 12D:
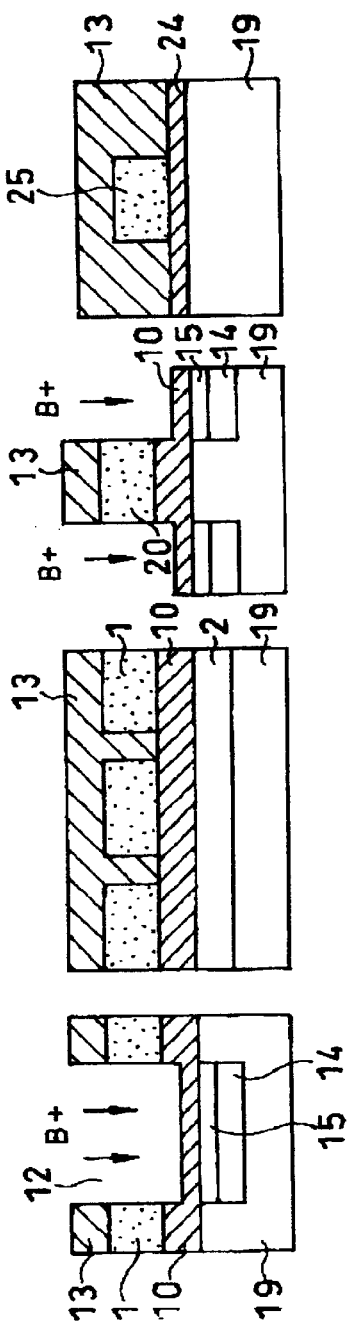

Thereafter, in order to form a buried photodiode, boron ions ($B^+$) are ion-implanted using the photo resist 13 and the charge transfer electrode 1 as a mask, to form a $P^+$ region 15, as shown in FIG. 12D. At this time, the boron ions are simultaneously implanted into the source/drain regions (as designated with the reference number 15 in the transistor section having the gate oxide film having the same thickness as that of the oxide film 10 on the charge transfer section 2, in FIG. 12D).

Figure 12E:
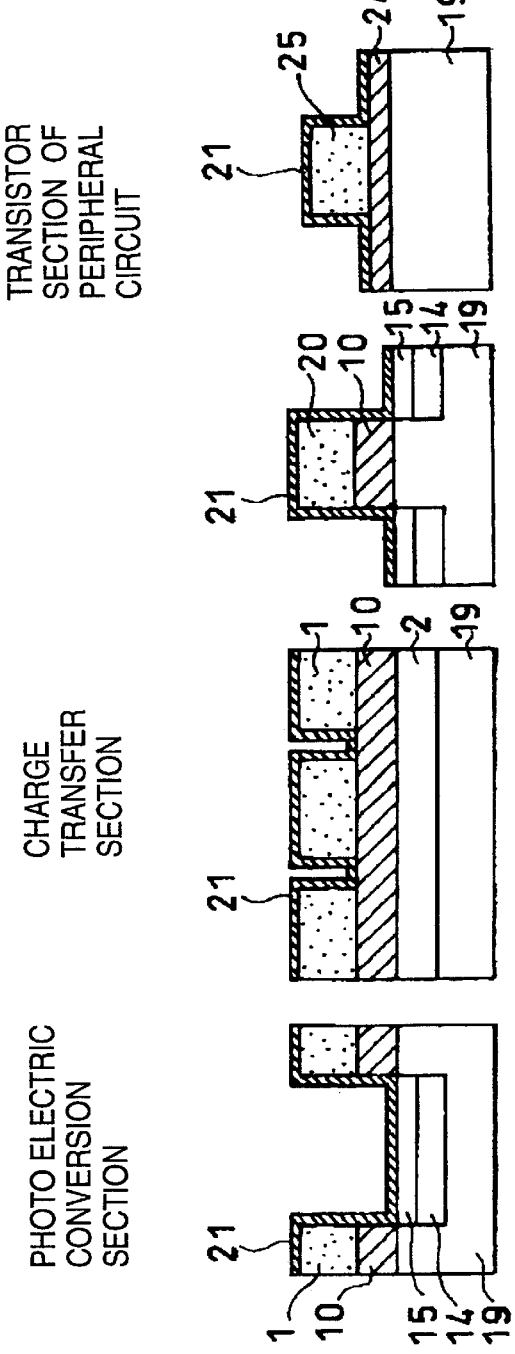

All of the gate oxide film 10 exposed in the photoelectric conversion section 3 and the peripheral circuit are removed by an etching, and the whole of the device is thermally oxidized to form an oxide film 21 to cover the whole of the device, as shown in FIG. 12E.

Figure 12F:
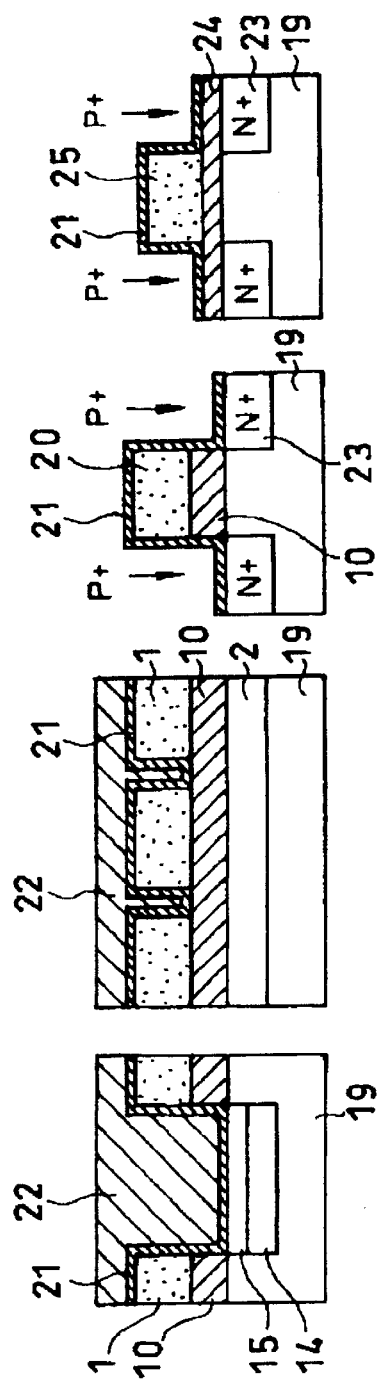

Succeedingly, in order to form $N^+$ regions which become source/drain regions in the transistor section of the peripheral circuit, a patterned photo resist 22 is formed to cover the photoelectric conversion section 3 and the charge transfer section 2, and for example, phosphorus ions ($P^+$) are ion-implanted using the patterned photo resist 22 and the gate electrodes 20 and 25, as a mask, so that $N^+$ diffused regions 23 are formed at opposite sides of each of the gate electrodes 20 and 25 as shown in FIG. 12F.

In this process, when the N-well 14 and the $P^+$ region 15 are formed in the photoelectric conversion section 3, the source/drain regions are already ion-implanted in the transistor section having the gate oxide film having the same thickness as that of the oxide film 10 on the charge transfer section 2. However, since the dose for forming the $N^+$ diffused regions 23 is far larger than the doses for forming the N-well 14 and the $P^+$ region 15, particularly, the dose of boron for forming the $P^+$ region 15, the $N^+$ diffused regions 23 can be sufficiently formed.

Figure 12G:
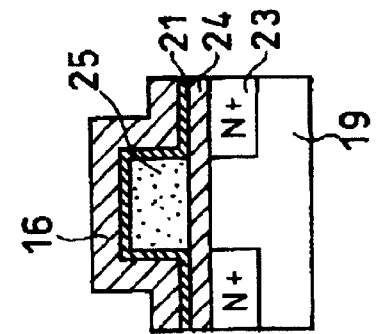
Figure 12G:
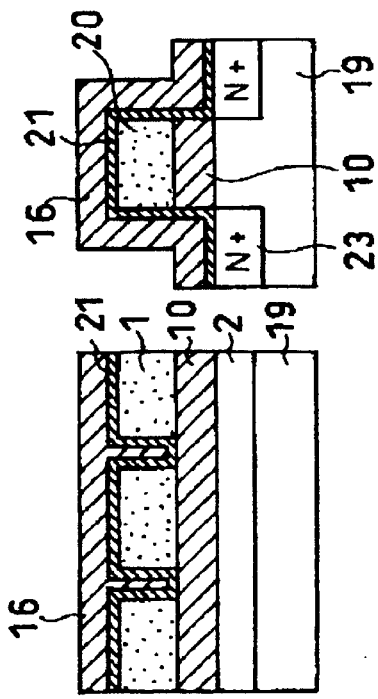
Figure 12G:
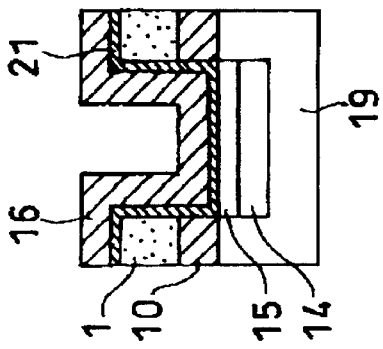

Thereafter, the patterned photo resist 22 is removed, and an interlayer insulator film 16 is formed as shown in FIG. 12G, and a light blocking or shielding metal film (not shown) is formed on the interlayer insulator film 16 to cover a region other than the photoelectric conversion section 3, as shown in FIG. 5E. Thus, the sixth embodiment of the solid state image sensor in accordance with the present invention is obtained.

In the sixth embodiment of the solid state image sensor in accordance with the present invention, the gate electrode 25 is patterned by the etching in the transistor section having the thin gate oxide film 24 at the same time as the charge transfer electrode material film 11 is patterned by the etching to form the individual charge transfer electrodes ($\phi 1$ to $\phi 4$) 1 which are separated from one another by the grooved separation regions 4. This etching is carried out in a condition that the gate oxide film 10 is almost not etched, and therefore, the thin gate oxide film 24 is never etch-removed to the effect that the underlying silicon substrate is exposed.

Furthermore, the gate electrode 20 in the transistor section having the gate oxide film having the same thickness as that of the oxide film 10 on the charge transfer section 2 at the same time as the opening 12 is etched to penetrate through the charge transfer electrode in the photoelectric conversion section 3, and in addition, after the charge transfer electrode material film 11 in the photoelectric conversion section 3 and the peripheral circuit is patterned by the etching, the gate oxide film 10 is etched to the desired thickness. Therefore, it is possible to control the immersing depth of the implanted ions so that the photoelectric conversion sections 3 and the $N^+$ diffused regions 23 can easily formed.

In the above mentioned embodiments, the charge transfer electrodes 1 are formed by patterning a single layer of polysilicon by means of the etching. However, it would be a matter of course to averaged persons skilled in the art that the charge transfer electrodes 1 can be formed of a metal film or a silicide film. In addition, the P-well is formed on the N-type semiconductor substrate, and the N-well becoming the photoelectric conversion section is buried in the P-well. However, the conductivity type can be reversed.

As mentioned above, in the solid state image sensor having the charge transfer electrode of the single-layer structure, the charge transfer electrode material film 11 is deposited on the whole surface of the device, and then patterned into the charge transfer electrodes 1 ($\phi 1$ to $\phi 4$) which, in turn, are separated by one another by the grooved separation regions 4, for each one pixel. Therefore, the opening 12 (for forming the photoelectric conversion section) is formed in the charge transfer electrode 18, of the charge transfer electrodes 1 ($\phi 1$ to $\phi 4$), which also functions as a signal charge reading electrode for reading a signal charge from the photoelectric conversion section 3 to the vertical charge transfer section 2, without overlapping with the grooved separation regions 4. Furthermore, the ions are implanted using the photo resist 13 used for forming the opening 12 and the charge transfer electrodes 1 as a mask.

Thus, the photoelectric conversion section 3 and the signal charge reading electrode can be formed with no positional deviation therebetween, so that it becomes possible to stabilize a reading characteristic for reading a signal charge from the photoelectric conversion section 3 to the vertical charge transfer section 2.

The invention has thus been shown and described with reference to the specific embodiments. However, it should be noted that the present invention is in no way limited to the details of the illustrated structures but changes and modifications may be made within the scope of the appended claims.

What is claimed is:

1. A solid state image sensor comprising:

a plurality of photoelectric conversion sections formed at a surface region of a first conductivity type semiconductor layer;

a charge transfer section of a second conductivity opposite to that of said first conductivity type semiconductor layer, said charge transfer section being formed in said surface region of said first conductivity type semiconductor layer, adjacent to said photoelectric conversion sections, to transfer a signal charge along said charge transfer section;

a plurality of charge reading sections each formed in said surface region of said first conductivity type semiconductor layer, between a corresponding one of said photoelectric conversion sections and said charge transfer section, for reading out a signal charge generated in the corresponding photoelectric conversion section, to said charge transfer section; and transfer electrodes formed of a single layer of conducting electrode material to cover, through a gate insulator film, said charge reading sections and said charge transfer section;

wherein said transfer electrodes are formed by selectively etch-removing said single layer of conducting electrode material at a plurality of first regions which divide said single layer of conducting electrode material in a row direction for each pixel, and at a second region positioned above each of said photoelectric conversion sections, said first regions and said second region being not overlapped to each other.

2. A solid state image sensor claimed in claim 1 wherein said photoelectric conversion sections are formed in a self alignment with said second regions where said single layer of conducting electrode material has been selectively removed from a position above each of said photoelectric conversion sections.

3. A solid state image sensor claimed in claim 1 wherein said tranfer electrodes are applied with charge transferring pulses which have different timings, respectively.

4. A solid state image sensor claimed in claim 1 wherein a gate electrode in a peripheral circuit of the solid state image sensor is formed by etch-patterning said single layer of conducting electrode material so that said gate electrode in said peripheral circuit is formed in the same etching process as said second region is formed by selectively removing said single layer of conducting electrode material from a position above each of said photoelectric conversion sections.

5. A solid state image sensor claimed in claim 1 further including a peripheral circuit including a first transistor having a gate insulator film of substantially the same film thickness as that of said gate insulator film in said charge transfer section, and a second transistor having a gate insulator film of a film thickness thinner than as that of said gate insulator film of said first transistor, and wherein a gate electrode of said first and second transistors in said peripheral circuit is formed by etch-patterning said single layer of conducting electrode material;

said gate electrode of said second transistor is formed at the same etching process as said single layer of conducting electrode material is etch-removed at said first regions; and said gate electrode of said first transistor is formed at the same etching process as said single layer of conducting electrode material is etch-removed at said second region.

6. A solid state image sensor comprising:

a semiconductor layer of a first conductivity type;

a plurality of photoelectric conversion sections disposed at a surface region of said semiconductor layer;

a charge transfer section of a second conductivity opposite to that of said first conductivity type, said charge transfer section disposed at said surface region of said semiconductor layer, substantially adjacent to said photoelectric conversion sections;

a plurality of charge reading sections disposed in said surface region of said semiconductor layer, between a corresponding one of said photoelectric conversion sections and said charge transfer section, said charge reading sections transfer a signal charge generated in said corresponding one of said photoelectric conversion sections to said charge transfer section; and a plurality of transfer electrodes formed of a single layer of conducting electrode material, said transfer electrodes cover said charge reading section and said charge transfer section;

wherein said transfer electrodes are formed by selectively etch-removing said conducting electrode material at a plurality of first regions thereby dividing said single layer of conducting electrode material into a plurality of rows, and at a plurality of second regions positioned above each of said photoelectric conversion sections, said first regions and said second regions not overlapping.

* * * * *